United States Patent [19]

Kadomura

[11] Patent Number: 5,738,752

[45] Date of Patent: Apr. 14, 1998

[54] SYSTEM AND METHOD FOR PLASMA ETCHING

[75] Inventor: Shingo Kadomura, Kanagawa, Japan

[73] Assignee: Sony Corporation, Japan

[21] Appl. No.: 673,048

[22] Filed: Jul. 1, 1996

[30] Foreign Application Priority Data

Jul. 5, 1995 [JP] Japan .................................. 7-169634

[51] Int. Cl.$^6$ .................................................. H01L 21/00
[52] U.S. Cl. ............................ 156/345; 438/728; 216/70
[58] Field of Search .. 156/345 MN, 345 ME–345 MG; 204/298.37–298.38; 438/728–732; 216/70

[56] References Cited

U.S. PATENT DOCUMENTS 5,061,838  10/1991  Lane et al. .......................... 156/345 X
5,290,993   3/1994  Kaji et al. .......................... 156/345 X
5,587,205  12/1996  Saito et al. ......................... 156/345 X

*Primary Examiner*—William Powell
*Attorney, Agent, or Firm*—Ronald P. Kananen

[57] ABSTRACT

A plasma etching system capable of preventing ion incident image and satisfying a high anisotropy and a high etching rate and a method using the same. A stage contains a high permeability material layer and it has a potential directly dropped to ground level, and magnetic lines of a magnetic field diffused from a plasma generation source are rendered incident on the stage in the direction substantially perpendicular thereto. This allows negative ions as well as positive ions in plasma to be incident on a substrate to be etched in the direction perpendicular thereto along the magnetic lines. As a result, since acceleration of ions by a sheath is not used it is possible to effectively prevent damage of the substrate.

5 Claims, 3 Drawing Sheets

SYSTEM AND METHOD FOR PLASMA ETCHING

BACKGROUND OF THE INVENTION

The present invention relates to a system and a method for plasma etching used in the field of manufacturing semiconductor devices, and particularly to a system and a method for plasma etching capable of satisfying requirements such as insignificant damage, a high selectivity and a high etching rate.

As there is a tendency toward thinning of a gate oxide film in the art, it becomes important to ensure a high etching selection ratio to an underlying gate oxide film upon processing a gate electrode.

In general, a high selection ratio to an underlying gate oxide layer upon processing a gate electrode is achieved by contriving gas chemistry depending on selection of etching species used for plasma etching. For example, in the case of patterning of a gate electrode material layer made of a polycrystalline silicon and a high melting point metal polycide, a high selection ratio can be obtained by adopting a condition wherein HBr is used as an etching gas and an inorganic material such as $SiO_2$ is used as an etching mask for excluding virtually all carbon components from an etching reaction system. This technique is described, for example, in Digest of Papers, 2nd. Microprocess Conference, 1989, p. 190, B-9-2; and Japanese Patent Laid-open No. Hei 2-224241.

In other words, an only numerical etching selection ratio can be sufficiently achieved by the existing plasma etching technique. However, for a gate electrode processing depending on only gas chemistry using a halogen based chemical species other than fluorine based chemical species etching, reaction products, such as $SiBr_x$ and $SiCl_x$, generally remain in the form of deposition on side walls of a pattern, and accordingly wet etching be performed in order to remove such residues. The wet etching, while being performed only for a short time, uses diluted hydrofluoric acid based processing solution, and accordingly it inevitably etches an underlying gate oxide film, to thereby reduce a substantial thickness of the remaining gate oxide film.

In a practical device structure, plasma etching is often performed for a material on an underlying material layer having a high step, and in some cases, a gate oxide film is exposed up to over-etching of about 100%. The surface of such a gate oxide film is etched by dilute hydrofluoric acid at an abnormally high etching rate, thereby remaining gate oxide film tends to be further reduced in thickness. This is reported, for example, by Proceedings of Symposium on Dryprocess, 1993, p. 137. This phenomenon is due to the fact that a gate oxide film is only slightly etched by ion bombardment upon over-etching; but is damaged due to the incidence of accelerated ions. The travel toward a thin gate oxide film corresponds with a tendency toward the finer design rule. For example, it is estimated to be 6 nm for a semiconductor device under the 0.25 μm rule and 4 nm for a semiconductor device under the 0.18 μm rule. Therefore, even when a high selection ratio is achieved by selection of an etching gas, it is anticipated that the thickness of a remaining gate oxide film exposed from a gate electrode cannot be substantially controllable by the subsequent wet-processing.

OBJECT AND SUMMARY OF THE INVENTION

An object of the present invention is to provide a plasma etching system capable of reducing ion emission image to a substrate to be etched while ensuring an etching selection ratio and of achieving a practical etching rate and a high anisotropy without dependence of only gas chemistry in plasma etching; and to provide a method of using the same.

To achieve the above object, according to a first aspect of the present invention, there is provided a plasma etching system including: a plasma generation source using at least a magnetic field; and a plasma processing chamber connected to the plasma generation source and containing a stage for mounting a substrate to be etched opposite to the plasma generation source; wherein the stage is set to have a ground potential; and the stage contains a high permeability material layer disposed substantially over the entire surface of the stage.

In this configuration, preferably, magnetic lines of a magnetic field diffused from the plasma generation source are rendered incident on the stage in the direction substantially perpendicular thereto by the effect of the high permeability material layer.

Examples of the high permeability materials used for this plasma etching system may include, but are not restricted to, ferromagnetic alloys, example of which may include various soft magnetic alloys such as Permalloy, Sendust and a silicon steel; and ferromagnetic compounds, examples of which may include various soft magnetic compounds such as MnZn ferrite. Such a high permeability material is formed in a thin plate and is disposed in a stage for mounting a substrate to be etched so as to be extended substantially over the entire surface of the stage, preferably, in a region including the entire area of the substrate in a plan view. In the case of using a high permeability alloy, it may be used to have a potential dropped to a ground potential. In the case of using a high permeability insulator, a ground electrode should to be provided separately. In each case, the uppermost surface of the stage is preferably formed of a ceramic material such as alumina for preventing contamination.

According to a second aspect of the present invention, there is provided a plasma etching method using the plasma etching system having the above configuration, wherein etching is performed by rendering incident at least negative ions on the substrate to be etched.

BRIEF DESCRIPTION OF THE DRAWINGS

FIG. 3A shows a state in which a high melting point metal polycide layer and a resist pattern are formed on a gate oxide film; FIG. 3B shows a state in which plasma etching for the high melting point metal polycide layer is completed; and FIG. 3C shows a state in which the resist pattern is ashed, followed by wet processing, to obtain a gate electrode composed of a high melting point metal polycide.

DETAILED DESCRIPTION OF THE PREFERRED EMBODIMENTS

Figure 1:
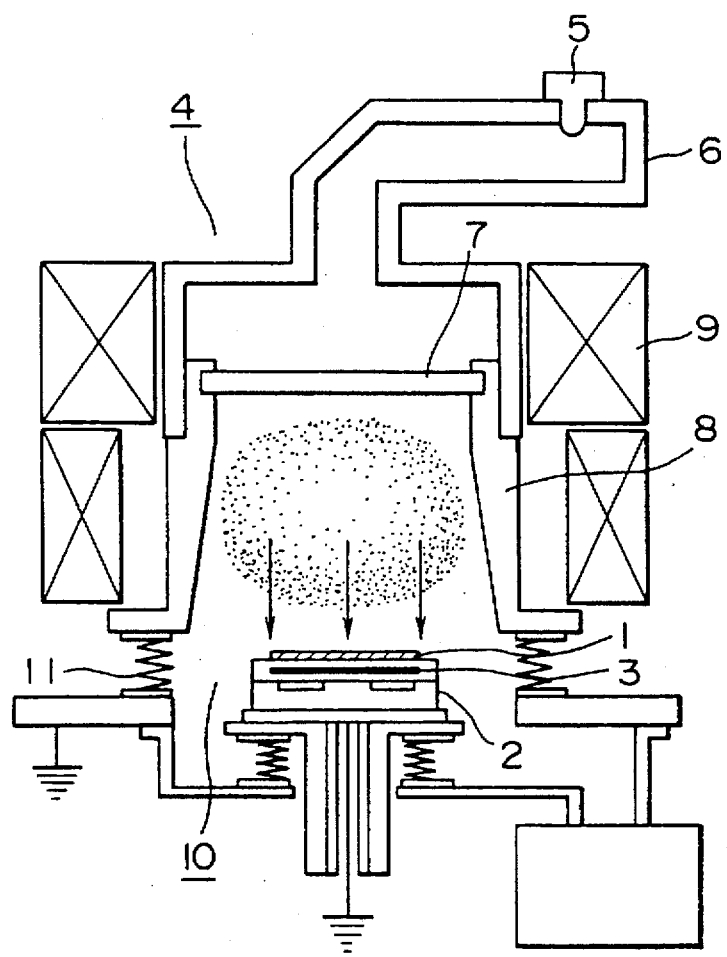
FIG. 1 is a schematic sectional view of a plasma etching system used in a first example of the present invention.

The present invention features negative ions, used as etching species for plasma etching, unlike the related art plasma etching.

When patterning a gate electrode on a gate oxide film, the thickness of a remaining gate oxide film exposed from the gate electrode must necessarily be uniform, especially considering the trend toward extremely thin gate oxide films. To satisfy this necessary requirement, it is essential to suppress accelerated etching of the gate electrode in a wet etching process as a post-treatment for removing the residues. Suppression of the incident ion energy as much as possible results in reduction of damage of the gate oxide film formed by ion bombardment in an over-etching process. When there is a low incident of accelerated ions having directivity, however, it becomes difficult to perform anisotropic processing which generates side etching and also to ensure a practical etching rate.

To solve the above problem, the present invention is intended to improve ion density by making use of negative ions in addition to positive ions generally used for anisotropic plasma etching.

A plasma of a halogen based gas generally used for plasma etching contains a large amount of negative ions, and if such negative ions are effectively used for etching, the number of incident ions is greatly increased preventing reduction in etching rate even when the incident ion energy is decreased. In an ordinary plasma etching, however, a stage for mounting a substrate to be etched is applied with a substrate bias or is made to have a floating potential through a blocking capacitor, and thereby a sheath (cathode dropped voltage region) is formed between the stage and plasma to generate a negative potential difference. As a result, the stage is made to have a negative potential so that negative ions are made repulsive and are not rendered incident on the substrate.

According to the plasma etching system of the present invention, the stage has a potential directly dropped to a ground potential, which allows the incidence of negative ions in addition to positive ions. However, when the stage has the ground potential, ions having directivity cannot be rendered incident on the surface of the stage. To overcome this problem, according to the present invention, magnetic lines are rendered incident on the surface of the stage in the direction substantially perpendicular thereto. An isomagnetic field plane is thereby formed on the surface of the stage in parallel thereto. This enables incidence of ions along such magnetic lines. Magnetic lines can be generated by provision of a separated magnetic field generation means. However, since the plasma etching system of the present invention uses a magnetic field as a plasma generation source, magnetic lines of a magnetic field diffused from the plasma generation source may be terminated in a high permeability material disposed in the stage. Thus, magnetic lines are rendered incident on the surface of the stage in the direction substantially perpendicular thereto.

The plasma etching system having the above configuration is therefore suitable for a plasma etching method capable of enhancing an incident ion density and satisfying a high anisotropy, a high selectivity, with insignificant damage. A system similar in configuration to that of the present invention has been disclosed, for example, in Japanese Patent Laid-open No. Hei 6-77146 wherein a magnetic coil is disposed under a stage for inducing magnetic lines to a substrate. The purpose of this method, however, is to achieve uniformity of plasma processing by controlling a coil current and rotating the coil, and it fails to disclose the configuration in which the stage has a ground potential and negative ions are used.

The present invention will be described in detail by way of the following examples:

A first example will be described below. In this example, a plasma etching system using an ECR type plasma generation source will be described with reference to a schematic sectional view shown in FIG. 1. A plasma generation source 4 of this plasma etching system generally includes a wageguide 6 for guiding a microwave having a frequency of 2.45 GHz produced by a magnetron 5; an Al alloy made block chamber 8 having an inner wall surface treated with alumite, which is provided so as to face the open end of the waveguide 6; a quartz or alumina microwave incident window 7 provided on the upper portion of the block chamber 8; and a solenoid coil 9 wound around the block chamber 8.

A plasma processing chamber 10 of this plasma etching system is constituted of a space facing the open end of the block chamber 8 and defined by chamber bellows, and it contains a stage 2 mounted with a substrate 1. The stage 2 contains a high permeability material layer 3 disposed nearly over the entire surface of the stage 2. In this example, the high permeability material layer 3 is formed of a thin plate (thickness: for example about 5 mm) made of Permalloy (Ni-22%Fe) and is buried in the stage 2 in such a manner as to be extended over a region wider than an area of the substrate 1 in a plan view. The high permeability material layer 3 made of Permalloy is excellent in conductivity, and can lower its potential directly to ground potential. The stage 2 has the uppermost surface coated with a ceramic material such as alumina. It is to be noted that the details of, for example, an etching gas inlet and the like are omitted in FIG. 1.

In this plasma etching system, a microwave having a frequency of 2.45 GHz produced by the magnetron 5 and entering the block chamber 8 by way of the waveguide 6 and the microwave incident window 7 acts to produce a plasma in the block chamber 8 in interaction with a magnetic field having a strength of 0.0875 T formed by the solenoid coil 9. The magnetic field formed by the solenoid coil 9 has a strength of about 0.15 T near the microwave incident window 7; 0.0875 T at the ECR surface in the block chamber 8; and about 0.01 T or more near the stage. Magnetic lines near the stage 2 are diffused in an ordinary ECR plasma etching system; however, in this plasma etching system, magnetic lines are uniformly rendered incident on the stage in the direction substantially perpendicular thereto, from the center to the peripheral edge of the substrate by the effect of the high permeability material layer 3 disposed in the stage 2.

This plasma etching system, which allows magnetic lines to be incident on the surface of the stage 2 in the direction substantially perpendicular thereto as described above, enables plasma etching with uniform perpendicular incidence of negative ions along the magnetic lines.

A second example will be described below. In this example, a plasma etching method using the plasma etching system described in the first example will be described with reference to FIGS. 3A to 3C, wherein a high melting point metal polycide layer on an extremely thin gate oxide film is patterned to form a gate electrode.

Figure 3A:
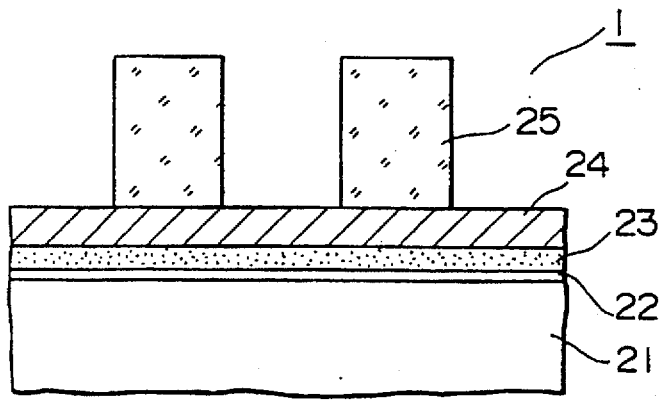
FIGS. 3A to 3C are schematic sectional views showing plasma etching steps in second and fourth examples of the present invention.

As shown in FIG. 3A, a substrate 1 to be etched in this example has a semiconducting substrate 21 made of silicon or the like which is formed thereon with, for example, a gate oxide film 22 made of a thermally oxidized film having a thickness of 4 nm; a polycrystalline silicon layer 23 containing impurities, formed by low pressure CVD; a high melting point metal silicide layer 24 made of $WSi_x$, formed by low pressure CVD; and a resist pattern 25 having a width of 0.20 μm. The substrate 1 is mounted on the stage 2 of the plasma etching system shown in FIG. 1, and the high melting point metal silicide layer 24 and the polycrystalline silicon layer 23 are continuously patterned in accordance with, for example, the following conditions:

| flow rate of $Cl_2$ | 100 sccm |
|---|---|
| gas pressure | 0.13 Pa |
| microwave power | 2500 W |
| substrate temperature | ordinary temperature |

Since $Cl_2$ used for this plasma etching has a large electronegativity, a large amount of negative ions are present in plasma, other than positive ions. In the ordinary plasma etching system, a sheath is formed between the stage and a plasma because a substrate bias is applied to the stage, and accordingly a negative bias voltage is generated from the stage so that only positive ions are accelerated and rendered incident on the substrate.

Figure 3B:
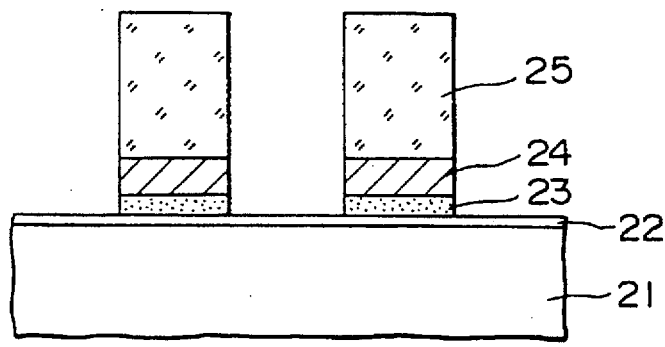

In this plasma etching system, however, since the stage has a ground potential and magnetic lines are generated in the direction perpendicular to the surface of the stage, negative ions as well as positive ions are rendered incident on the surface of the substrate along the magnetic lines, to thereby achieve low damage anisotropic processing at a practical etching rate. The substrate after completion of over-etching is shown in FIG. 3B.

Figure 3C:
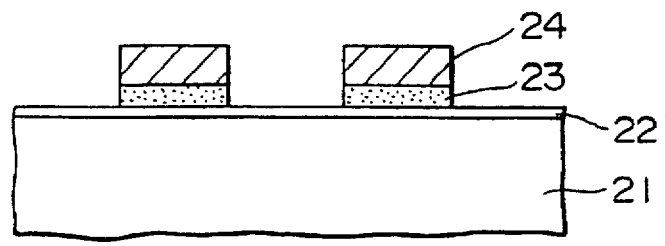

Accordingly, in the substrate after completion of resist separation and post-treatment using dilute hydrofluoric acid subsequent to plasma etching, a high melting point metal polycide gate electrode having a preferable shape shown in FIG. 3C can be finally formed without any reduction in thickness of the extremely thin gate oxide film 22 due to accelerated etching.

This plasma etching method makes it possible to process a gate electrode with insignificant damage, a high selection ratio and a practical etching rate by adopting the ECR plasma etching system using incidence of uniform negative ions.

Figure 2:
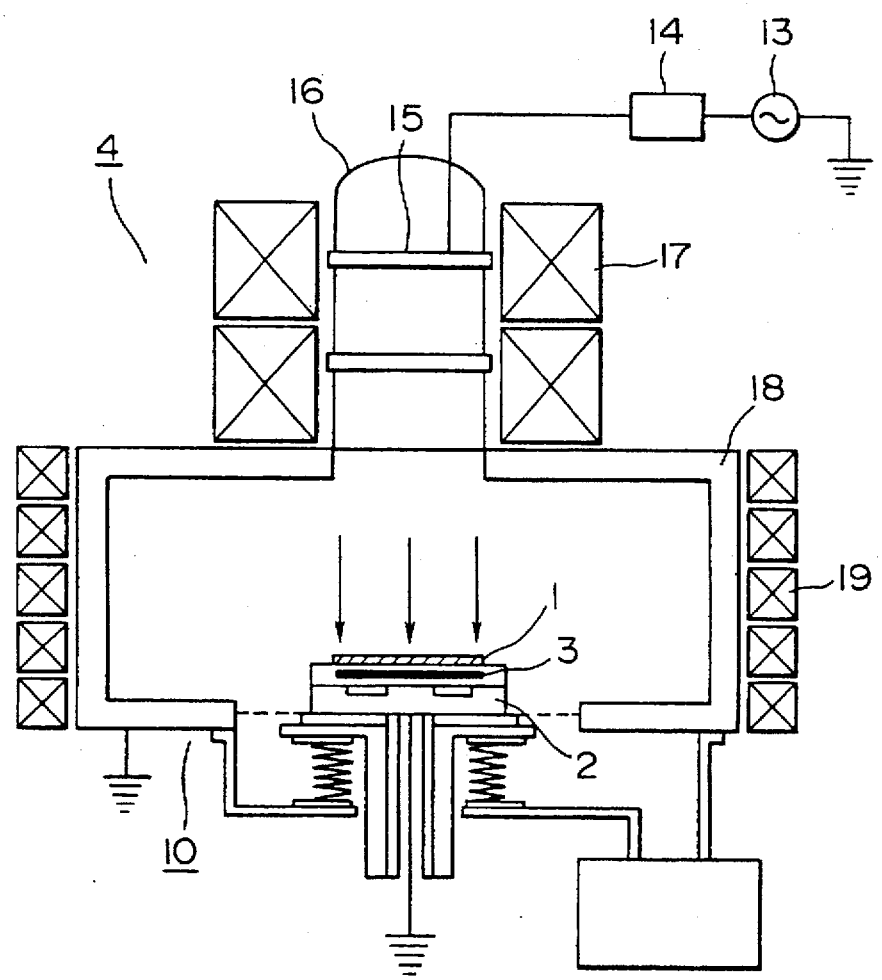
FIG. 2 is a schematic sectional view of a plasma etching system used in a third example of the present invention.

A third example will be described below. In this example, a plasma etching system using a helicon wave plasma generation source will be described with reference to a schematic view shown in FIG. 2. A plasma generation source 4 of this plasma etching system has a general configuration that an RF power having a frequency of 13.56 MHz is produced by a helicon wave power supply 13 and is supplied to a helicon wave antenna 15 disposed around the outer periphery of a bell jar 16 made of a dielectric material such as alumina by way of a matching box 14a, to generate a helicon wave (whistler wave), and the helicon wave thus generated is propagated by a magnetic field produced by a solenoid coil disposed around the outer periphery of the helicon antenna 15.

A plasma processing chamber 10 of this plasma etching system is constituted of a space defined by an Al alloy diffusion chamber 18 having the inner wall treated with alumite and facing the open end of the bell jar 16, and the outer surface of the side wall of the diffusion chamber 18 is further surrounded by multi-pole magnets 19. The diffusion chamber 18 contains a stage 2 mounted with a substrate 1 to be etched. The stage 2 contains a high permeability material layer 3 disposed nearly over the entire surface of the stage 2. In this example, the high permeability material layer 3 is formed of a thin plate (thickness: for example about 5 mm) made of Sendust (Fe-Al-Si alloy) in such a manner as to be extended over a region wider than an area of the substrate 1 in a plan view. The high permeability material layer 3 made of Sendust is excellent in conductivity and can lower its potential directly to a ground potential. The stage 2 has the uppermost surface coated with a ceramic material such as alumina for preventing the high permeability material layer 3 from being directly exposed. It is to be noted that the details of, for example, an etching gas inlet and the like are omitted in FIG. 2.

In this plasma etching system, a helicon wave plasma generated by the helicon wave antenna 15 is propagated by the magnetic field formed by the solenoid coil 17 and is carried to the diffusion chamber 18. The magnetic field formed by the solenoid coil 17 has a strength of about 0.05 T near a microwave incident window 7, and about 0.01 T near the stage in the diffusion chamber 18. Magnetic lines near the stage 2 are diffused in an ordinary helicon wave plasma etching system; however, in this plasma etching system, magnetic lines are uniformly rendered incident on the stage in the direction substantially perpendicular thereto from the center to the peripheral edge of the substrate due to the high permeability material layer disposed in the stage 2.

This plasma etching system, which allows magnetic lines to be incident on the surface of the stage 2 in the direction substantially perpendicular thereto as described above, enables plasma etching using uniform perpendicular incidence of negative ions along the magnetic lines. As compared with the ECR plasma etching system described in the first example, the helicon wave plasma etching system in this example makes it possible to lower the strength of the magnetic field generated by the solenoid coil 17, and to obtain a plasma density having an ion density larger by about one digit.

A fourth example will be described below. In this example, a plasma etching method using the plasma etching system described in the third example will be described with reference to FIGS. 3A to 3C, in which a high melting point metal polycide layer on an extremely thin gate oxide film is patterned to form a gate electrode.

A substrate 1 to be etched shown in FIG. 3A in this example has the same configuration as that of the substrate 1 shown in the second example, and therefore the overlapped explanation is omitted. The substrate 1 is mounted on a stage 2 of the helicon wave plasma etching system shown in FIG. 2, and a high melting point metal silicide layer 24 and a polycrystalline silicon layer 23 are continuously patterned in accordance with, for example, the following plasma etching conditions:

| flow rate of $Br_2$ | 100 sccm |
|---|---|
| gas pressure | 0.13 Pa |
| microwave power | 2500 W |
| substrate temperature | ordinary temperature |

Since $Br_2$ used for this plasma etching has a large electronegativity, a large amount of negative ions are present in plasma, other than positive ions. In the ordinary plasma etching system, a sheath is formed between the stage and a plasma because a substrate bias is applied to the stage, and accordingly a negative bias voltage is generated from the stage so that only positive ions are accelerated and rendered incident on the substrate.

In this plasma etching system, however, since the stage has a ground potential and magnetic lines are generated in the direction perpendicular to the surface of the stage, negative ions as well as positive ions are rendered incident on the surface of the substrate along the magnetic lines, to thereby achieve anisotropic processing at a practical etching rate. Moreover, since positive ions and negative ions are only rendered incident by the magnetic field, it is possible to prevent virtually any bombardment of accelerated incident ions by a sheath accompanied by an ordinary anisotropic plasma etching, and hence to prevent generation of a damage layer of the gate oxide film 22. The substrate after completion of over-etching is shown in FIG. 3B.

Accordingly, in the substrate after completion of resist separation and post-treatment using dilute hydrofluoric acid subsequent to plasma etching, a high melting point metal polycide gate electrode having a preferable shape shown in FIG. 3C can be finally formed without any reduction in thickness of the extremely thin gate oxide film 22 due to accelerated etching.

This plasma etching method enables high density plasma etching with insignificant damage, a high selection ratio and a practical etching rate by adopting the helicon wave plasma etching system with uniform incidence of negative ions.

Although the four examples of the present invention have been described, the present invention is not limited thereto.

The ECR plasma generation source and the helicon wave plasma generation source have been exemplified as the plasma generation source; however, the present invention is not limited thereto and may be applicable to a plasma etching system having a plasma generation source of a type using at least a magnetic field.

The high permeability material layer is exemplified by Permalloy or Sendust in the examples. However, it may be formed of a thin plate made of a soft magnetic ferrite such as a soft magnetic steel or Mn-Zn ferrite.

With respect to a substrate to be etched, the present invention is applicable to a plasma etching method for various etching layers requiring reduced ion damage and not withstanding high in anisotropy and etching rates, other than gate electrode processing.

What is claimed is:

1. A plasma etching system comprising:

a plasma generation source using at least a magnetic field; and a plasma processing chamber connected to said plasma generation source and containing a stage for mounting a substrate to be etched opposite to said plasma generation source;

wherein said stage is set to have a ground potential; and said stage contains a high permeability material layer disposed substantially over the entire surface of said stage.

2. A plasma etching system according to claim 1, wherein magnetic lines of a magnetic field diffused from said plasma generation source are rendered incident on said stage in the direction substantially perpendicular thereto by the effect of said high permeability material layer.

3. A plasma etching system according to claim 1, wherein said plasma generation source is an ECR plasma generation source.

4. A plasma etching system according to claim 1, wherein said plasma generation source is a helicon wave plasma generation source.

5. A plasma etching method using said plasma etching system according to claim 1, wherein etching is performed by rendering incident at least negative ions on said substrate to be etched.

* * * * *